US006687146B2

United States Patent
Kurjanowicz et al.

(10) Patent No.: US 6,687,146 B2
(45) Date of Patent: Feb. 3, 2004

(54) INTERLEAVED WORDLINE ARCHITECTURE

(75) Inventors: Wlodek Kurjanowicz, Kanata (CA); David Chi Wing Kwok, Kanata (CA)

(73) Assignee: Atmos Corporation, Kanata (CA)

( * ) Notice: Subject to any disclaimer, the term of this patent is extended or adjusted under 35 U.S.C. 154(b) by 23 days.

(21) Appl. No.: 10/059,414

(22) Filed: Jan. 31, 2002

(65) Prior Publication Data
US 2002/0131291 A1 Sep. 19, 2002

(30) Foreign Application Priority Data
Mar. 14, 2001 (CA) .............................................. 2340985

(51) Int. Cl.[7] .............................. G11C 5/06; G11C 5/02; G11C 11/24; G11C 7/00; G11C 7/02
(52) U.S. Cl. .............................. 365/63; 365/72; 365/51; 365/52; 365/149; 365/190; 365/208
(58) Field of Search ............................ 365/72, 63, 208, 365/190, 149, 51, 52

(56) References Cited

U.S. PATENT DOCUMENTS

| | | | |
|---|---|---|---|
| 4,700,328 A | | 10/1987 | Burghard |
| 5,034,920 A | * | 7/1991 | Rountree ..................... 365/72 |
| 5,687,132 A | * | 11/1997 | Rao ....................... 365/230.03 |
| 5,864,496 A | | 1/1999 | Mueller et al. |
| 5,946,254 A | * | 8/1999 | Tsuchida .................... 365/208 |
| 6,069,815 A | * | 5/2000 | Mueller et al. ............... 365/63 |
| 6,075,720 A | | 6/2000 | Leung et al. |
| 6,121,128 A | | 9/2000 | Hakey et al. |
| 6,141,236 A | * | 10/2000 | Kengeri ....................... 365/63 |
| 2001/0039089 A1 | * | 11/2001 | Noble ......................... 438/253 |
| 2002/0138688 A1 | * | 9/2002 | Hsu et al. ................... 711/105 |
| 2003/0067081 A1 | * | 4/2003 | Keeth .......................... 257/776 |
| 2003/0067829 A1 | * | 4/2003 | Keeth et al. ................ 365/222 |

* cited by examiner

Primary Examiner—David Nelms
Assistant Examiner—Ly Duy Pham
(74) Attorney, Agent, or Firm—L. Anne Kinsman; Borden Ladner Gervais LLP

(57) ABSTRACT

A high-density folded bitline memory array architecture is disclosed. High memory cell packing density is achieved by dividing polysilicon wordlines into short individual segments in the folded bitline scheme. Each wordline segment forms the gate of one or two DRAM memory cell transistors, and each segment is connected to a metal wordline, or conductor having low resistivity. By eliminating spaces between the memory cells due to passing wordlines, a cell arrangement and density similar to open bitline schemes is achieved. Further packing is obtained by arranging two columns of memory cells parallel to each bitline, each column offset with the other by a predetermined pitch. Therefore, by increasing the number of memory cells connected to each complementary bitline pair, each bitline pair can be cut in half and connected to its own bitline sense amplifier to reduce the bitline capacitance. Hence the memory cell architecture of the present invention occupies less area, and operates with faster speed than memory cell architectures of the prior art.

19 Claims, 10 Drawing Sheets

US 6,687,146 B2

INTERLEAVED WORDLINE ARCHITECTURE

FIELD OF THE INVENTION

The present invention relates to DRAM memories. More particularly the invention relates to a high packing density folded bitline DRAM memory array architecture.

BACKGROUND OF THE INVENTION

Aggressive development in dynamic random access memory (DRAM) fabrication processes and the small DRAM cell size makes commodity DRAM the highest density memory today. The high density of DRAM makes it very attractive for portable electronic devices that require large amounts of memory, but in a relatively small package. A further development is full integration of electronic components onto a single silicon chip. Examples of this include application specific integrated circuits (ASIC) that pack logic functions, DSP's, microcontrollers and memory onto a single semiconductor chip. In most ASIC applications, memory tends to occupy a relatively large percentage of area, therefore it is desirable to minimize the amount of area occupied by the integrated memory.

It is well known to practitioners in the art that a single DRAM memory cell typically includes an n-channel or p-channel access transistor connected in series to a storage capacitor. The storage capacitor can be of the stacked, trench or planar type. Of the three types, a DRAM using planar type storage capacitors is the least expensive to manufacture, whereas the stacked and trench capacitor processes require additional complex steps over planar storage capacitor DRAM processes. Although stacked and trench capacitor DRAM's are found in commodity DRAM devices, they are less prevalent in highly integrated chips such as ASICs. This is because current manufacturing processes optimized for trench and stacked capacitor DRAM memory are not optimized for logic circuits. Similarly, manufacturing processes optimized for logic are not optimized for DRAM memory. Therefore, devices manufactured with one optimized process will either have memory or logic circuits operating at sub-standard performance levels. Although hybrid DRAM/logic processes have been developed, they are still relatively expensive and do not allow the memory and logic circuits to perform at their full potential.

Since planar capacitor DRAM processes are very similar to standard logic manufacturing processes, ASIC devices integrating logic with planar capacitor DRAM benefit from less expensive manufacturing costs and high performance from both logic circuits and memory. However, the reduced manufacturing cost for planar capacitor type dynamic memory is offset by the relatively poor packing density of its cells, resulting in DRAM arrays of lower density than memory arrays employing stacked or trench capacitors for the same area. Trench and stacked capacitor cells have storage capacitors built vertically relative to the semiconductor substrate to reduce the surface area occupied by the cell. Planar capacitor cells on the other hand, require large amounts of semiconductor surface area because their capacitor plates are formed on the same plane as the substrate surface.

There are two widely used DRAM memory array layout architectures, called open bitline and folded bitline architectures. Examples of the folded bitline architecture are shown in FIGS. 1 and 2, and an example of the open bitline architecture is shown in FIG. 3. Both architectures illustrate the arrangement of bitline sense amplifiers (BLSA), bitlines, planar capacitor memory cells and wordlines (WL) with respect to each other.

The schematic of FIG. 1 illustrates the poor packing density of planar capacitor cells arranged in a folded bitline architecture. In this particular example four bitlines, ten wordlines labelled as WL to WL+9, and a corresponding number of memory cells are shown. The folded bitline architecture of FIG. 1 will now be described. Each BLSA 10 is connected to a pair of complementary bitlines 12 and 14, labelled as BLi, BLi* and BLi+1, BLi+1*, which extend in parallel from one side of BLSA 10. Planar capacitor cells 16 are connected to each of the bitlines 12 and 14 via a respective bitline contact 18. Bitlines 12 and 14 are typically formed of aluminum above the cells 16 and polysilicon wordlines 24. Each cell 16 includes a cell plate diffusion, or active area 20 and an access transistor active area 22. Polysilicon wordlines 24 run in a direction perpendicular to the bitline direction, and cross over access transistor diffusion areas 22 of any cell 16 in their path. The cells 16 connected to the same wordline are commonly referred to as a row of memory cells. It should be noted that only the diffusion areas of the cells 16 are shown to simplify the figure, however, those of skill in the art will understand that a thin oxide dielectric layer covers each cell plate active area 20, which is then covered by a polysilicon layer acting as a capacitor plate. Those of skill in the art will also understand that prior to the deposition of the polysilicon wordlines 24, transistor gate oxides are formed over the memory cell access transistor channel regions. Planar capacitor cell fabrication methods are well known in the art, and do not require further discussion. The cells 16 of each row are interleaved with an adjacent row of cells 16 to maximize the packing density of the cells along the bitline direction. However, passing wordlines that run between two back-to-back cells 16, as shown in areas 26, limit the extent to which the cells can be packed together. There is the added disadvantage that the wordlines are formed of polysilicon, which has relatively high resistivity when compared to metal. Titanium or tungsten silicided wordlines have been used to reduce the effective resistance of the polysilicon wordlines, however, they are still more resistive than aluminum interconnections. Therefore this higher resistivity slows memory access times.

A solution proposed in the prior art to increase memory cell packing density along the wordline direction for folded bitline architectures is shown in FIG. 2. The architecture is almost identical to the architecture shown in FIG. 1, except for the shape of the memory cells. In FIG. 2, each memory cell includes a rectangular shaped cell plate active area 21 and an access transistor active area 22. Polysilicon wordlines 24 run in a direction perpendicular to the bitline direction, and cross over access transistor diffusion areas of all cells in their path. It is noted that each pair of memory cells sharing the same bitline contact form a "C" shape. Complementary bitlines 12 and 14 are connected to each bitline sense amplifier 10, and each bitline makes contact to a plurality of cells. To save space, every alternate row of "C" shaped pair of memory cells has its pairs of memory cells rotated by 180 degrees. This way, the bitline contacts 18 in a column are offset with each other, allowing the complementary bitlines to be placed closer together. Unfortunately, this arrangement results in a poor cells/bitline ratio, and as with the architecture shown in FIG. 1, the long polysilicon wordlines slow the memory access time.

The schematic of FIG. 3 illustrates planar capacitor memory cells arranged in an open bitline architecture. All the elements shown in FIG. 3 are identical to those described in FIG. 1, except that they are arranged differently. More specifically, the complementary pair of bitlines 12 and 14 extend from opposite sides of BLSA 10. Now there are no passing wordlines, and a memory cell packing density higher than that for the folded bitline architecture shown in FIG. 1 is achieved. In addition, a polysilicon top cell plate 28 is shown overlayed upon the cell plate diffusion areas 20 of the cells connected to wordlines WL+5 and WL+6. Similar top cell plates are formed over all the cell plate diffusion areas 20, but not shown in FIG. 3 to simplify the schematic. However, unbalanced noise in a complementary pair of bitlines is a problem that is undesired because an activated wordline capacitively couples to all the bitlines it crosses, adding noise to those bitlines. For example, in the open bitline scheme of FIG. 3, wordline 24 only crosses bitline 12 while bitline 14 remains undisturbed. This inbalance can cause read errors by BLSA 10. This problem is not significant in the folded bitline architecture of FIG. 1 because the same wordline 24 crosses both bitlines 12 and 14, leaving both bitlines 12 and 14 balanced during wordline activation.

Another problem with the proximal arrangement of planar capacitor cells is potential capacitive coupling between adjacent back-to-back storage capacitors. In the example shown in FIG. 3, the back-to-back cell plate active areas 20 of memory cells along adjacent rows are typically covered by a common polysilicon cell plate that is connected to a cell plate potential. Although field oxide isolation is formed between each cell plate diffusion area 20, leakage can still occur due to the parasitic field oxide transistor that is formed between the adjacent cell plate diffusion areas 20. This leakage will cause stored charge do dissipate, resulting in reduced retention time, increased refresh rates and power consumption.

Additionally, as arrays become larger, bitlines become longer, adding undesired capacitance and slowing the operating speed. Polysilicon wordlines also become longer, adding more resistance to the wordlines.

Therefore, there is a need for a folded bitline memory architecture that allows for high memory cell packing density, and improved performance by reducing the wordline resistance and bitline capacitance.

SUMMARY OF THE INVENTION

It is an object of the present invention to obviate or mitigate at least one disadvantage of the prior art. In particular, it is an object of the present invention to provide folded bitline architecture having high memory cell packing density and reduced wordline and bitline resistance and capacitance.

In a first aspect, the present invention provides a folded bitline memory array. The folded bitline memory array has pairs of memory cells in a linear row, each pair of memory cells being coupled to a complementary folded bitline. Logically different wordline segments are coupled to each pair of memory cells, and metal wordlines are coupled to logically identical wordline segments.

In an embodiment of the present aspect, the pairs of memory cells in the linear row are adjacent to each other or interleaved with each other. The memory cells can be planar capacitor DRAM cells and the memory cells of two adjacent rows of memory cells share the same bitline contacts. In a further aspect of the present embodiment, rows of memory cells with back-to-back planar capacitors are offset with each other by a predetermined pitch, where the predetermined pitch can be up to one half of a memory cell pitch.

In yet another embodiment of the present aspect, each polysilicon wordline segment is coupled to two memory cells of the row of memory cells. In an alternative embodiment, each polysilicon wordline segment is coupled to four memory cells of the row of memory cells. In a further embodiment of the present aspect, each metal wordline is coupled to half of the memory cells of the row of memory cells and alternate polysilicon wordline segments of the row of memory cells are connected to the same metal wordline. The memory cells can be dual port planar capacitor DRAM cells in yet another embodiment of the present aspect.

In another aspect, the present invention provides a folded bitline memory array having a first memory cell linearly adjacent to a second memory cell, a folded bitline connected to the first memory cell, a complementary folded bitline connected to the second memory cell, a first wordline segment coupled to the first memory cell, and a second wordline segment coupled to the second memory cell where the first and second wordline segments are logically different wordlines.

In an embodiment of the present aspect, the first memory cell shares a bitline contact with a third memory cell linearly adjacent to a fourth memory cell, and the second memory cell shares a common bitline contact with the fourth memory cell. In a further aspect of the present embodiment, the first, second, third and fourth memory cells have planar storage capacitors, and two rows of linearly adjacent memory cells are offset with each other by a predetermined pitch.

In a further aspect, the present invention provides a folded bitline memory array having a first, second, third and fourth memory cell, a first and second folded bitline, a first and second complementary folded bitline, and a first and second wordline segment. The first memory cell is linearly adjacent to a second memory cell. The third memory cell is linearly adjacent to the second memory cell and the fourth memory cell. The first folded bitline is connected to the first memory cell. The first complementary folded bitline is connected to the third memory cell. The second folded bitline is connected to the second memory cell. The second complementary folded bitline is connected to the fourth memory cell. The first wordline segment is coupled to the first and second memory cells. The second wordline segment is coupled to the third and fourth memory cells, and the first and second wordline segments are logically different wordlines Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

A high-density folded bitline memory array architecture is disclosed. High memory cell packing density is achieved by dividing polysilicon wordlines into short individual segments in the folded bitline scheme by connecting more memory cells to each bitline. Each wordline segment forms the gate of one to four DRAM memory cell transistors, and each segment is connected to a metal wordline, or conductor having low resistivity. By eliminating spaces between the memory cells due to passing wordlines, a cell arrangement and density similar to open bitline schemes is achieved. Therefore, by increasing the number of memory cells connected to each bitline, the bitlines can be made shorter to reduce bitline capacitance. Hence the memory cell architecture of the present invention occupies less area, and operates with faster speed than memory cell architectures of the prior art.

Figure 1:
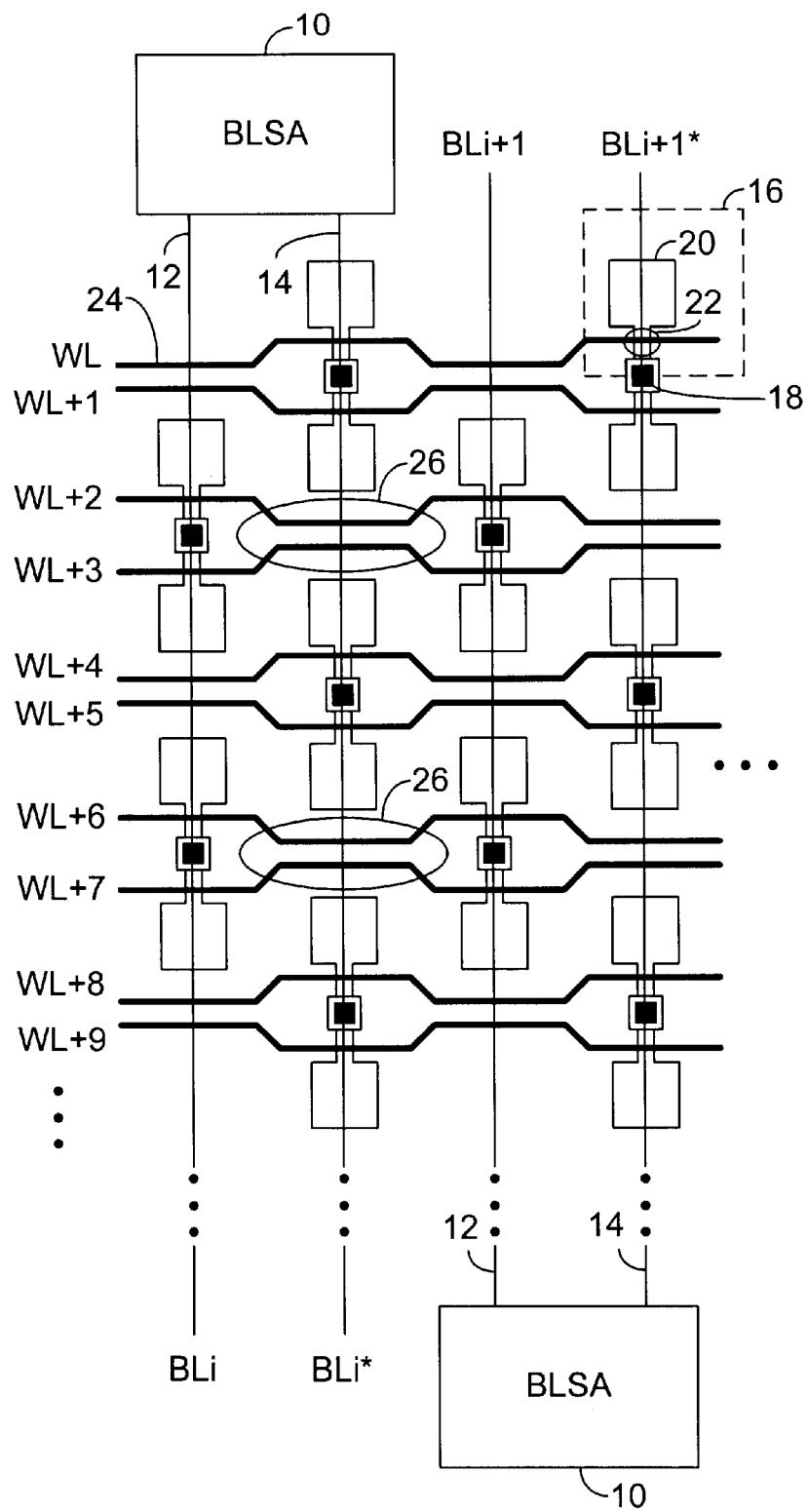
FIG. 1 shows the general layout of a conventional planar capacitor cell folded bitline architecture.
Figure 2:
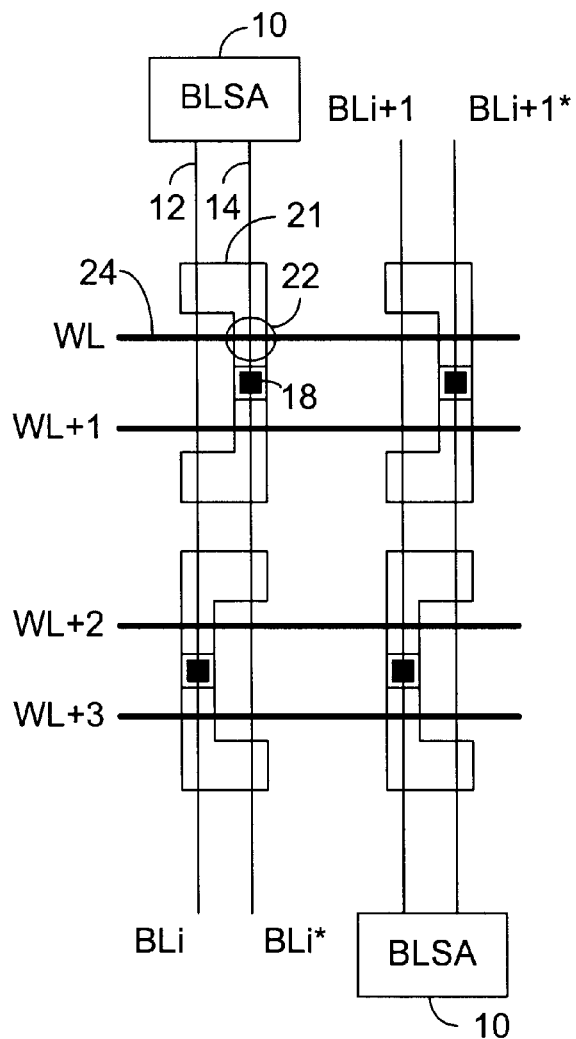
FIG. 2 shows the general layout of another conventional planar capacitor cell folded bitline architecture.
Figure 4:
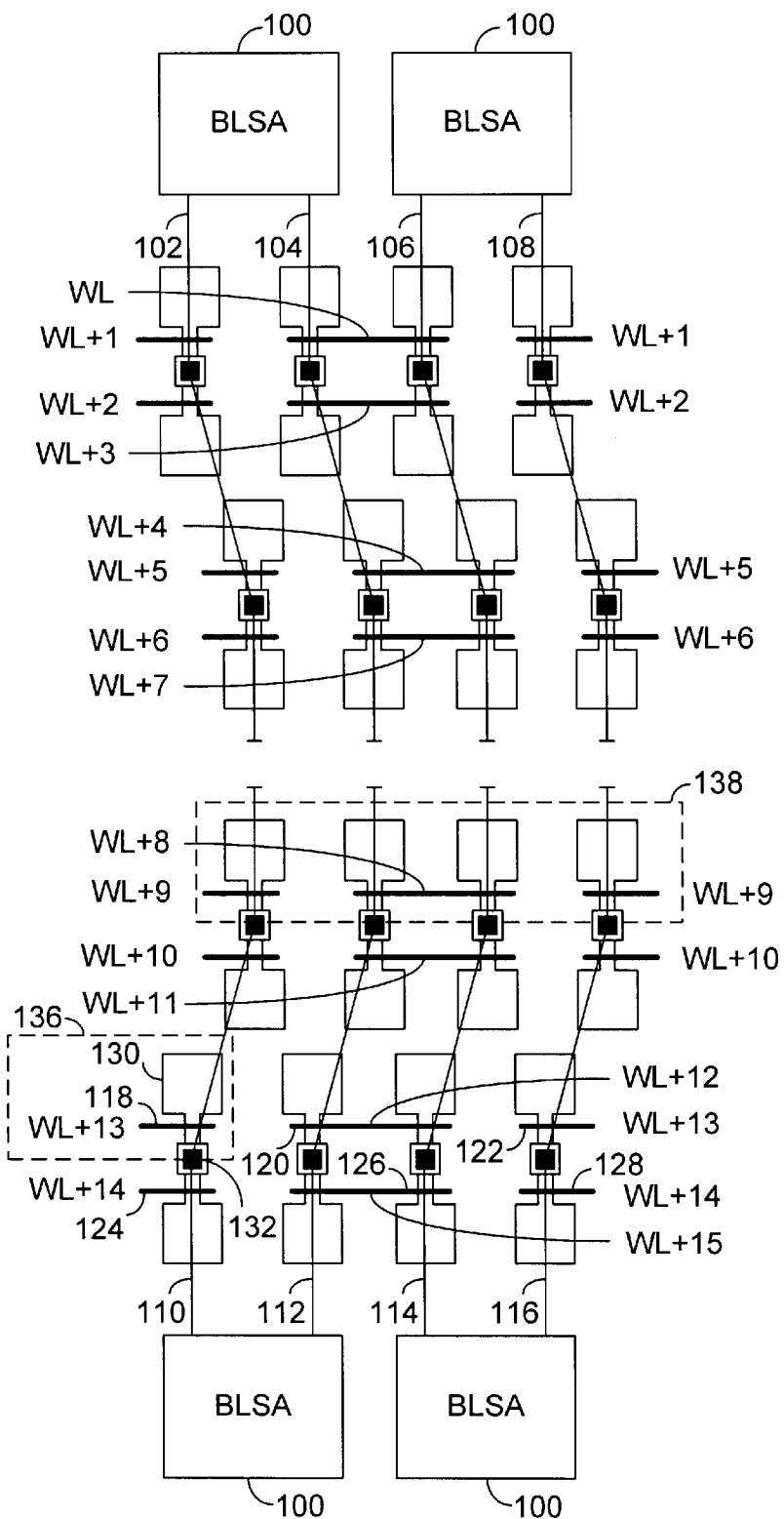
FIG. 4 shows the general layout of the interleaved wordline architecture according to an embodiment of the present invention.

An embodiment of the interleaved wordline architecture of the present invention is shown in FIG. 4. FIG. 4 is a schematic showing the general layout of folded metal bitlines, bitline sense amplifiers, planar capacitor memory cells and polysilicon wordline segments. Although only four bitline sense amplifiers and respective folded bitline pairs are shown, they are representative of the layout of an entire memory block or array. Each bitline sense amplifier (BLSA) 100 is connected to a respective complementary pair of folded bitlines, 102/104, 106/108, 110/112 and 114/116. The folded bitline pairs are arranged in a back-to-back configuration within the same memory block. More specifically, bitline pairs 102/104 and 110/112 are placed in the back-to-back configuration as are bitline pairs 106/108 and 114/116. Bitline pairs 102/104 and 106/108 can be considered one array within the block while bitline pairs 110/112 and 114/116 can be considered a second array within the block. Each bitline is connected to a plurality of planar capacitor memory cells 136. Every memory cell 136 includes a planar capacitor active area 130 and an access transistor, where the drain terminal of the access transistor is connected to the planar capacitor active area 130 and the source terminal of the access transistor is connected to a bitline contact 132. The gate of the access transistor is formed by the portion of the polysilicon wordline segment that covers the access transistor channel region. As seen in FIG. 4, the memory cells 136 are arranged in linear rows, one linear row which is indicated by dashed box 138. More specifically, all the memory cells in a linear row, referred from this point forward as a row, are aligned along a common axis. For example, all the top capacitor active area edges of the first row of memory cells are aligned. Every memory cell 136 in row 138 is connected to a bitline in the memory block. Furthermore, the memory cells of the row are paired such that each cell of the pair is connected to a complementary bitline coupled to the same bitline sense amplifier 100. In the present embodiment, every pair of memory cells 136 of the row are positioned adjacent to each other. For example, the pair of memory cells of the same row coupled to bitlines 102 and 104 are adjacent to another pair of memory cells coupled to bitlines 106 and 108. Such an arrangement provides improved packing over the traditional folded bitline architecture shown in FIG. 1 where every memory cell in a row is only connected to half the bitlines in the memory block, because the cells of the row are packed as close together as possible. Adjacent rows of memory cells having back-to-back planar capacitors are offset with each other by a predetermined pitch, as shown by the second and third rows of memory cells from the top of FIG. 4. The arrangement of the wordline segments is now discussed with reference to the last two rows of memory cells in FIG. 4. The four memory cells of the second last row of memory cells are coupled to three wordline segments 118, 120 and 122. The four memory cells of the last row of memory cells are coupled to three wordline segments 124, 126 and 128. Wordline segments 118, 122, 124 and 128 are each coupled to a single memory cell because the memory cells they are coupled to are located on the edges of the memory block. Wordline segments 120 and 126 are each coupled to two adjacent memory cells, where each of the two adjacent memory cells is connected to one bitline of a different pair of complementary bitlines. The wordline segments connected to two adjacent memory cells are preferably not segmented to increase packing density of the memory cells along the wordline direction. Because wordline segments 118 and 122 are connected to the same metal wordline (not shown), they are the same logical wordline. Wordline segment 120 is logically different from wordline segments 118 and 122, and are therefore connected to a different metal wordline (not shown). Hence, in the embodiment shown in FIG. 4, alternate wordline segments in a row of memory cells are logically the same and connected to the same metal wordline. For example in the last row of memory cells, wordline segments 128 and 124 are WL+14 wordlines while wordline segment 126 is a WL+15 wordline. One skilled in the art will understand that if the memory block of FIG. 4 was wider and included more folded bitline pairs, then the two previously mentioned metal wordlines would make contact with all their corresponding logical wordline segments in the row.

The interleaved wordline architecture embodiment of FIG. 4 provides several advantages over the folded bitline architectures of the prior art. By offsetting the adjacent back-to-back rows of memory cells, the field oxide leakage area between the back-to-back planar capacitors is minimized and storage cell charge retention is improved. Higher retention leads to a reduction in the refresh rate and subsequently, power consumption. The offset between back-to-back rows of memory cells can be up to one half the pitch of the cell, where the cell pitch is defined as the cell width plus the space to the adjacent cell. It should be noted that in alternate embodiments, the array shown in FIG. 4 can be arranged without an offset between back-to-back rows of memory cells. The division of traditional continuous polysilicon wordlines into segments eliminates passing wordlines throughout the array, and allows two adjacent memory cells of the same row to make contact with both bitlines of a complementary pair of folded bitlines. Therefore, wasted space within the memory block is reduced. Furthermore, compared to the traditional folded bitline architecture shown in FIG. 1, the bitlines of the high-density folded bitline architecture of the present embodiment can be made shorter while making contact to the same number of memory cells. For example, the bitlines can be made 50% shorter than bitlines of the prior art connected to the same number of memory cells. The resulting lower bitline capacitance improves memory access performance. Additionally, the area occupied by the memory block would be smaller than prior art folded bitline memory blocks containing the same number of memory cells. Since the wordlines are mainly formed in metal, such as aluminum, and connected to short polysilicon wordline segments, memory access performance is further improved.

Memory access operations for the interleaved wordline architecture embodiment shown in FIG. 4, such as read or write operations from and to the memory cells, are performed in exactly the same manner as prior art folded bitline architectures. Therefore, the peripheral circuits such as wordline drivers and column decoders do not need to be modified to take advantage of the interleaved wordline architecture of the present embodiment.

The embodiment of FIG. 4 illustrates a memory block consisting of back-to-back configuration of folded bitlines, however in alternative embodiments of the present invention, the memory block can be configured as a single row of folded bitlines and respective bitline sense amplifiers. Additionally, the metal bitlines and wordlines are typically fabricated with aluminum, but can also be fabricated with other suitable metals such as copper, or any low resistivity metal.

Figure 5:
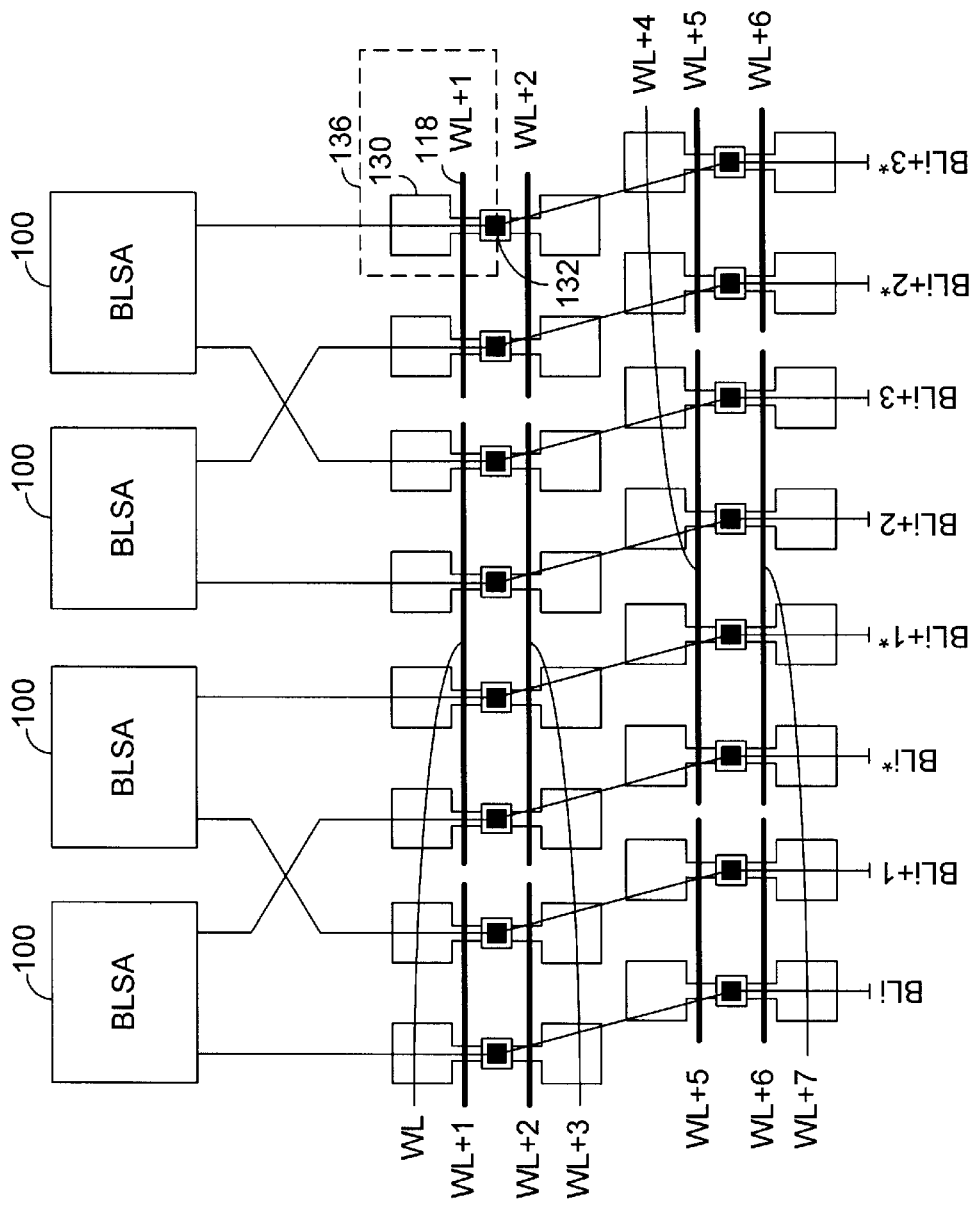
FIG. 5 shows the general layout of the interleaved wordline architecture according to an alternate embodiment of the present invention.

FIG. 5 shows an alternate embodiment of the present invention where each wordline segment can be connected to four memory cells of the same row. The arrangement of BLSA 100 and memory cells 136 in FIG. 5 is identical to that in FIG. 4 except that the first wordline segments from the left and right sides of the figure are connected to two adjacent cells of the same row, followed by a wordline segment connected to four adjacent cells of the same row. Since the complementary bitlines of one BLSA 100 cannot be connected to memory cells sharing the same logical wordline, some of the bitlines swap physical positions with each other, or are twisted, such that they are connected to memory cells connected to different logical wordlines. For example in FIG. 5, BLi+1 and BLi* have swapped positions, as have BLi+3 and BLi+2*. As in FIG. 4, pairs of memory cells are coupled to a complementary bitline of the same bitline sense amplifier 100, but the pairs of memory cells in the present embodiment are interleaved with each other. For example, the pair of memory cells of the same row coupled to BLi and BLi* are interleaved with another pair of memory cells coupled to BLi+1 and BLi+1*.

FIGS. 4 and 5 illustrate embodiments of the present invention applied to single port DRAM memory. The present invention can also be applied to dual port DRAM memory.

Figure 6:
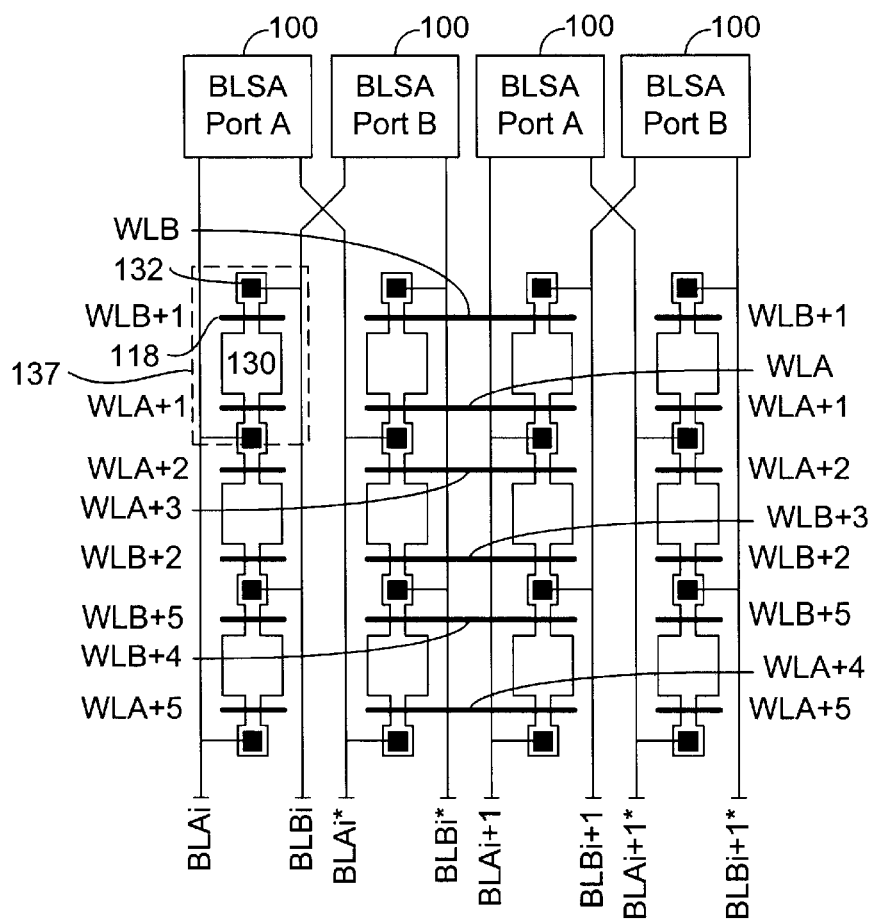
FIG. 6 shows the general layout of the interleaved wordline architecture for a dual port memory embodiment of the present invention.

FIG. 6 shows the general layout of a dual port DRAM memory according to another embodiment of the present invention. Dual port memories permit two simultaneous accesses to the memory, and moreover, permit simultaneous access to the same memory cell because each cell is connected to two different bitlines. The dual port DRAM memory of FIG. 6 includes BLSA's 100 for ports A and B, each connected to a respective pair of complementary bitlines, and dual port planar capacitor DRAM cells 137. Each dual port cell 137 includes one capacitor plate active area 130 and two access transistors, where the drain terminals of the access transistors are connected to the planar capacitor active area 130 and the source terminals of the access transistors are connected to respective bitline contacts 132. The gates of the access transistors are formed by the portion of the polysilicon wordline segment 118 that covers the access transistor channel region. Each bitline contact 132 of the dual port cell 137 is connected to a bitline associated with a BLSA 100 of a different port. As shown in FIG. 6, dual port cell 137 is connected to bitlines BLAi for port A and BLBi for port B. The wordline segments 118 are divided into two groups, WLA to WLA+5 and WLB to WLB+5. The wordline segments WLA to WLA+5 are associated with port A and the wordline segments WLB to WLB+5 are associated with port B. In every dual port cell 137, each wordline segment is connected to a wordline associated with a different port. Therefore the same dual port cell 137 can be accessed simultaneously. In the present embodiment, the segmented wordlines 118 allow for a compact arrangement of dual port cells 137, reducing the size of the memory array. Since the dual port cells 137 of the same column are effectively a single diffusion area, the packing density of the dual port cells 137 is maximized along the bitline direction because no field oxide isolation is required between vertically adjacent cells. In a configuration similar to that shown in FIG. 4, the dual port cells 137 of the same row are paired, where each pair of dual port cells is positioned adjacent to another pair of dual port cells. In an alternate embodiment, the bitline sense amplifiers for port A can be located on one side of the memory array while the bitline sense amplifiers for port B can be located on the opposite side of the memory array.

FIGS. 4 to 6 have only generally depicted embodiments of the interleaved wordline architecture in schematic form. The schematic of FIG. 4 does not show polysilicon capacitor top plates, metal wordlines or the intermediate connectors which couple the metal wordlines to the polysilicon segments. The improved packing density of the interleaved wordline architecture is best illustrated through layout diagrams of the memory block.

Figure 3:
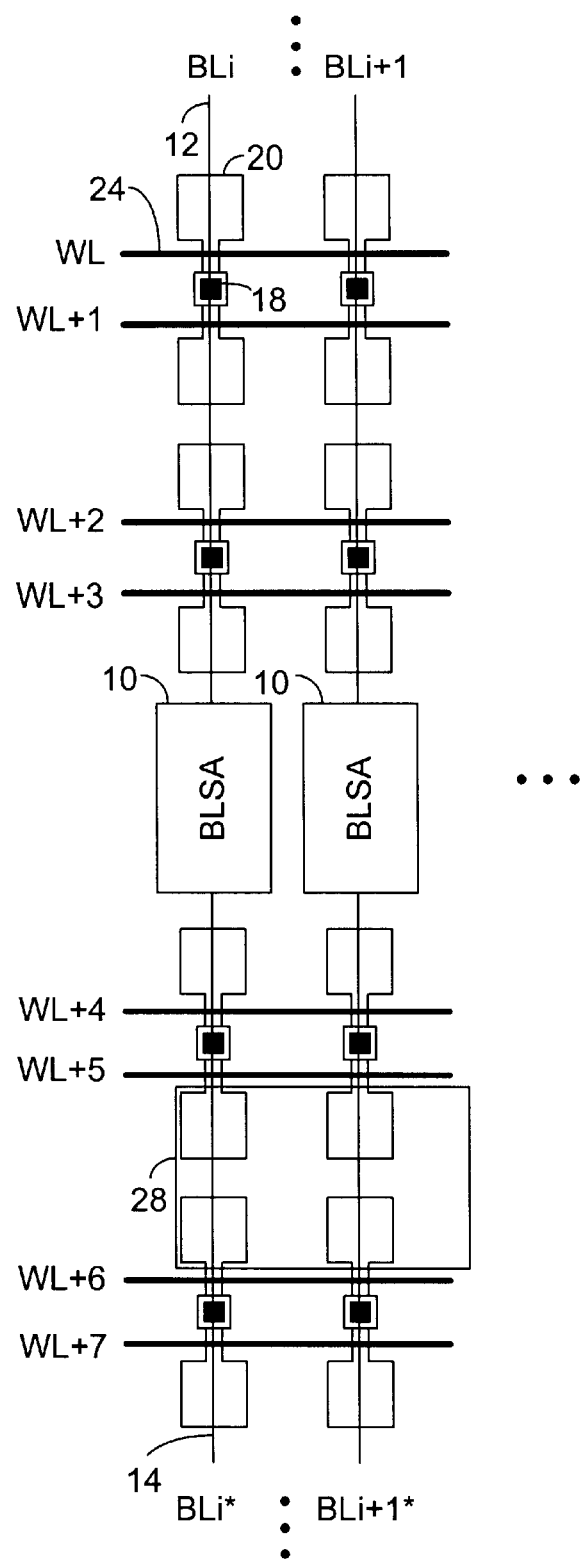
FIG. 3 shows the general layout of a conventional planar capacitor cell open bitline architecture.
Figure 7:
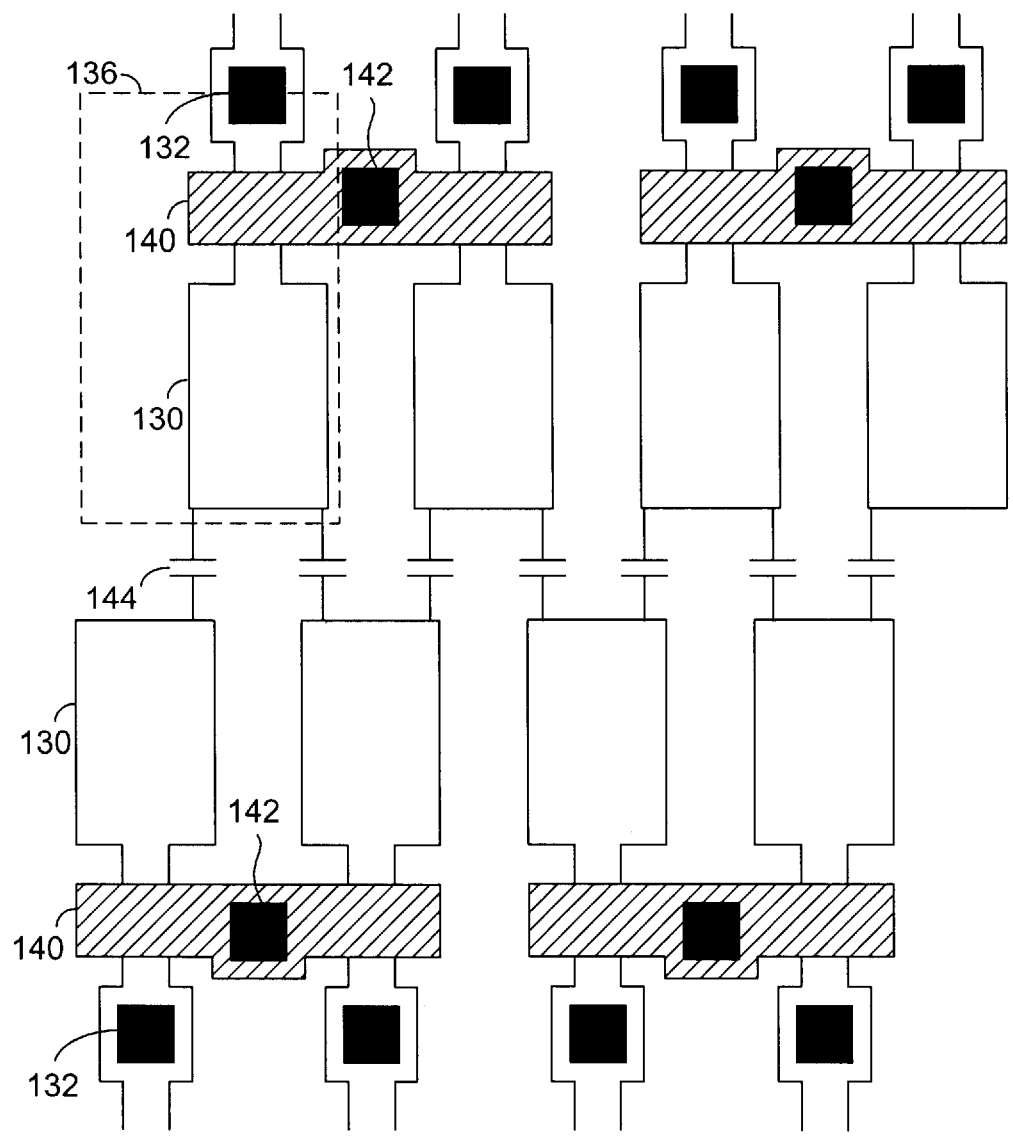
FIG. 7 shows a detailed view of planar capacitor memory cell active areas arranged in an embodiment of the interleaved wordline architecture of the present invention.

FIG. 7 is an enlarged view of a memory block of FIG. 4 arranged according to an embodiment of the present invention. The metal wordlines and bitlines, as well as polysilicon top plates of the planar capacitors are not shown to simplify the schematic. FIG. 7 shows eight memory cells 136 within a memory block, where each memory cell 136 is the same as the memory cell of the same reference numeral shown in FIG. 4. As previously mentioned, each memory cell 136 includes a capacitor plate active area 130 connected in series with an access transistor having a polysilicon gate. Each polysilicon segment 140 forms the gates of two adjacent memory cell access transistors, and has a polysilicon segment contact 142. Bitline contacts 132 are formed at the source terminal of each access transistor and shared by two memory cells 136. In subsequent process steps, metal 1 intermediate metal connectors are formed over, and make electrical contact with each polysilicon segment 140 via the polysilicon segment contacts 142. Also, metal 1 bitlines are formed, and make electrical contact with each memory cell 136 via the bitline contacts 132. The metal wordlines, bitlines and intermediate metal connectors are discussed in more detail below. FIG. 7 also shows some capacitive coupling 144 between the planar capacitor active areas. Due to the offset arrangement between the two rows of back-to-back memory cells, each capacitor active area 130 is weakly coupled to two capacitor active areas instead of being strongly coupled to one capacitor active area. In particular, the offset arrangement between the capacitor active areas reduces parasitic field oxide transistor leakage when compared to arrangements where capacitor active areas are not offset, as in the open bitline architecture shown in FIG. 3.

Figure 8:
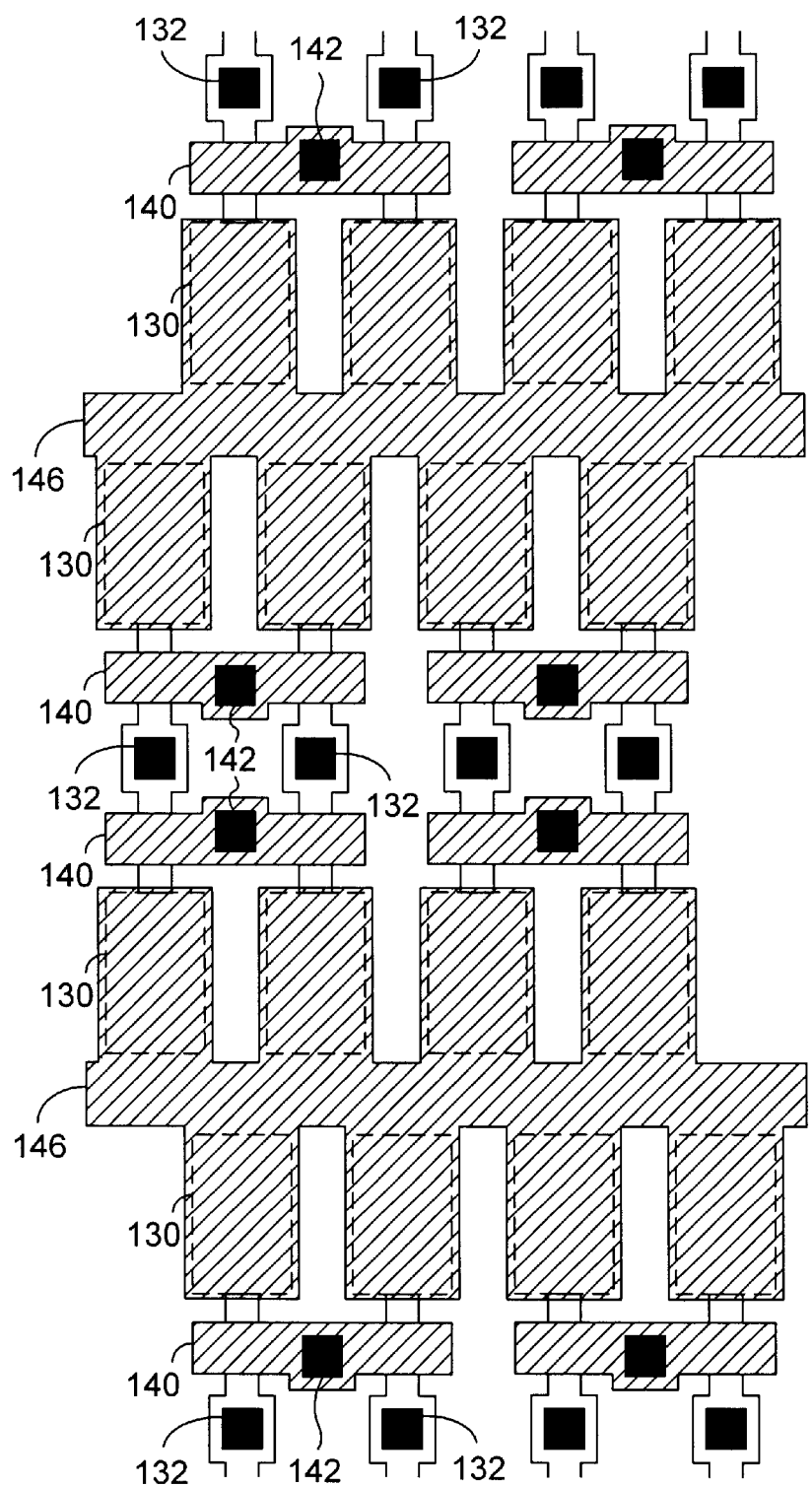
FIG. 8 shows a polysilicon layer of a portion of a memory array arranged in an embodiment of the interleaved wordline architecture of the present invention.
Figure 9:
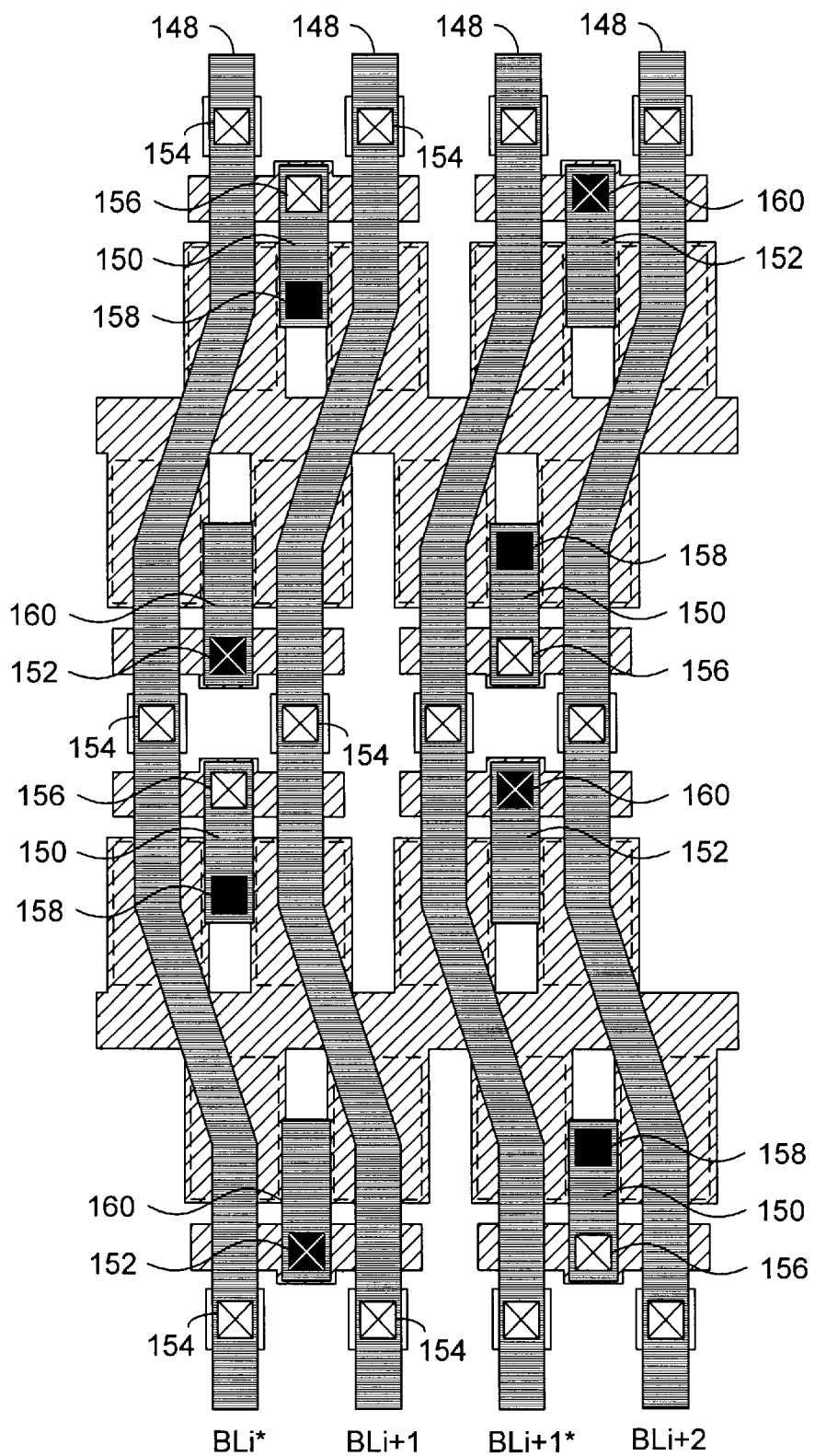
FIG. 9 shows the memory array portion of FIG. 8 with metal 1 bitlines and vias; and, FIG. 10 shows the memory array portion of FIG. 9 with metal 2 wordlines.
Figure 10:
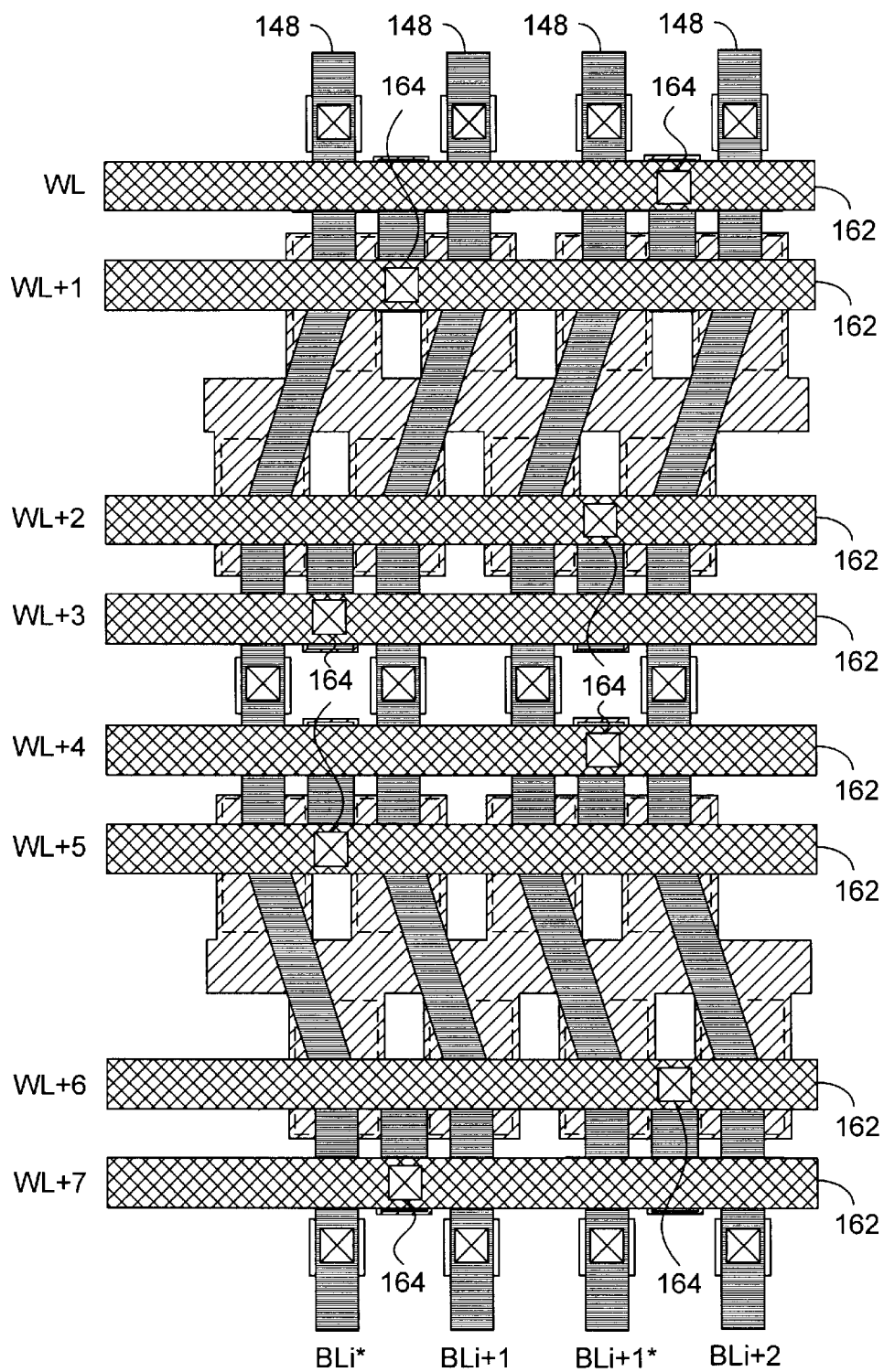

FIGS. 8 through 10 sequentially illustrate the deposition of metal layers upon a semiconductor substrate to form a memory block configured according to an embodiment of the interleaved wordline architecture of the present invention.

FIG. 8 is a lower magnification layout view of the memory block shown in FIG. 7, but with a polysilicon top plate 146 covering the planar capacitor active areas 130. Polysilicon top plate 146 is shown as having slots between adjacent cells, however the top plate 146 can be formed as a continuous top plate without the slots in an alternate embodiment of the present invention. The reference numerals appearing in FIG. 8 refer to the same elements as in FIG. 7. At the fabrication stage of FIG. 8, the access transistor active areas and planar capacitor active areas 130, shown as dashed lines, have been implanted into the substrate, and the polysilicon segments 140 and capacitor plates 146 have been formed. Polysilicon segments 140 and capacitor plates 146 are shown as being the same type of polysilicon and formed at the same time. However, multiple polysilicon processes are available and polysilicon segments 140 and capacitor plates 146 can be formed of different polysilicon layers. Capacitor plates 146 are typically connected to a common cell plate potential level, VCP. Additionally, gate oxides and thin oxide capacitor dielectrics have been formed prior to polysilicon deposition, but cannot be seen since they are sandwiched between the substrate and the polysilicon segments 140 and capacitor plates 146 respectively. Contacts 132 and 142, depicted as black squares, indicate areas where an overlying metal layer is to make electrical and physical contact with the bitlines and polysilicon segments 140 respectively.

FIG. 9 shows the layout of FIG. 8 with metal 1 layer conductors formed over the polysilicon and substrate. More specifically, the metal 1 layer conductors are formed over a passivation layer such as phosphosilicate glass, previously deposited over the polysilicon layer. At this stage, a deposited blanket layer of metal 1, such as aluminum, has been patterned and etched to form bitlines 148, intermediate connectors 150 and dummy connectors 152. The bitlines 148 have been labelled as BLi*, BLi+1, BLi+1* and BLi+2, where BLi+1 and BLi+1* are a complementary pair. Bitlines BLi and BLi+2* are not shown in FIG. 9. The bitlines 148 transfer data to and from the memory cells, and the intermediate and dummy connectors 150 and 152 respectively couple the polysilicon segments 140 to metal wordlines formed later in metal 2. The metal 2 wordlines are further discussed in the description of FIG. 10. Each bitline 148 is electrically and physically connected to the source terminals of the memory cell access transistors underneath it through bitline vias 154. Bitline vias 154 are depicted as white squares with an "X" to indicate areas of the bitline that have made contact with the bitline contacts 132 underneath. Each intermediate connector 150 has one end positioned over a respective polysilicon segment 140, and is electrically and physically connected to it through connector vias 156. Connector vias 156 are depicted in the same manner as the bitline vias 154. Each intermediate connector 150 has connector contacts 158 located at the end opposite to the connector vias 156. Connector contacts 158 are depicted as black squares to indicate areas where overlying metal 2 layer wordlines are to make electrical and physical contact with the intermediate connectors 150. Dummy connectors 152 are formed into a shape identical to intermediate connectors 150, and have a common connector via and connector contact area 160 depicted as a black square with a white "X". The white "X" of the common via-contact area 160 indicates where the dummy connector 152 makes electrical and physical contact with a polysilicon segment 140 underneath, and the black indicates the area where an overlying metal 2 layer wordline is to make electrical and physical contact with the dummy connector 152. While the dummy connectors 152 couple the polysilicon segments 140 to metal 2 layer wordlines, they also serve an additional purpose. Dummy connectors 152 help maintain a substantially planar surface topology for more reliable formation of the overlying metal 2 wordlines. The dummy connectors 152 can be omitted in alternate embodiments, and metal 2 wordlines can make direct contact to the polysilicon segments 140 underneath. In alternate embodiments, connectors 150 and 152 could be positioned over respective polysilicon segments 140 at any point along their lengths, or made longer, depending on the desired design. Additionally, connectors 150 and 152 could be formed in a second polysilicon layer instead of a metal 1 layer as described in FIG. 8.

FIG. 10 shows the layout of FIG. 9 with metal 2 layer conductors formed over the metal 1 layer conductors. More specifically, the metal 2 layer conductors are formed over a passivation layer, such as phosphosilicate glass, previously deposited over the metal 1 layer. Metal wordlines 162 have been formed in a direction perpendicular to the bitlines 148. In particular, the metal wordlines 162 are formed over the intermediate connectors 150, which were formed in metal 1 as shown in FIG. 9. Eight metal wordlines 162 are shown, labelled from WL to WL+7, each making electrical and physical contact to one intermediate connector 150 or dummy connector 152. The metal wordlines 162 are connected to the intermediate connectors 150 and dummy connectors 152 at wordline vias 164, depicted as white squares with an "X". The connectors 150 and 152 couple polysilicon segments 140 to their corresponding metal wordlines 162. For example, in the top row of memory cells, metal wordline WL is connected to the second polysilicon segment 140 from the left through dummy connector 152. Metal wordline WL+1 is connected to the first polysilicon segment 140 from the left through intermediate connector 150. WL passes the first polysilicon segment 140 and WL+1 passes the second polysilicon segment 140. In a wider memory block having many memory cells and folded bitlines, each metal wordline 162 is coupled to alternate polysilicon segments 140 of the same row. Therefore each metal wordline 162 is coupled to half of the polysilicon segments 140 in a row of memory cells.

The present embodiment shown in FIG. 10 allows for relaxed spacing between metal wordlines 162 and results in empty space through which additional metal 2 layer signal lines can be routed. For example, clock signals can be routed through the memory array in metal 2 instead of around the memory array. Although a third metal layer could be used to route the clock signal over the memory array, addition of the third metal layer increases the manufacturing cost of the device.

In an alternate embodiment of the present invention, intermediate connectors 150 are not used, and metal 2 wordlines make direct contact to each respective polysilicon segment 140 through small branches that extend from the metal 2 wordlines.

High density memory arrays occupying minimal semiconductor area can be manufactured according to the interleaved wordline architecture of the present invention. Not only are such memory arrays smaller than prior art folded bitline memory arrays, but bitline capacitance, wordline resistance and capacitor to capacitor coupling is reduced. Better performance and reduced power consumption over prior art folded bitline memory arrays is therefore obtained when planar capacitor DRAM memory arrays are configured according to embodiments of the interleaved wordline architecture. The embodiments of the present invention can be applied to commodity DRAM as well as embedded DRAM in system-on-chip devices. Although the present embodiments use planar capacitor memory cells, other DRAM memory cells such as stacked or trench capacitor memory cells, or FRAM cells can be used as well.

The above-described embodiments of the invention are intended to be examples of the present invention. Alterations, modifications and variations may be effected the particular embodiments by those of skill in the art, without departing from the scope of the invention which is defined solely by the claims appended hereto.

What is claimed is:

1. A folded bitline memory array comprising:
   pairs of memory cells in a linear row, each pair of memory cells coupled to a complementary folded bitline;
   logically different wordline segments coupled to each pair of memory cells; and metal wordlines coupled to logically identical wordline segments.

2. The folded bitline memory array of claim 1, wherein the pairs of memory cells in the linear row are adjacent to each other.

3. The folded bitline memory array of claim 1, wherein the memory cells of one pair of memory cells are adjacent to each other, the one pair of memory cells being located between the memory cells of another pair of memory cells.

4. The folded bitline memory array of claim 1, wherein the pairs of memory cells in the linear row are interleaved with each other.

5. The folded bitline memory array of claim 1, wherein the memory cells include planar capacitor DRAM cells.

6. The folded bitline memory array of claim 1, wherein the memory cells of two adjacent rows of memory cells share the same bitline contacts.

7. The folded bitline memory array of claim 5, wherein rows of memory cells with back-to-back planar capacitors are offset with each other by a predetermined pitch.

8. The folded bitline memory array of claim 7, wherein the predetermined pitch is up to one half of a memory cell pitch.

9. The folded bitline memory array of claim 1, wherein each polysilicon wordline segment is coupled to two memory cells of the row of memory cells.

10. The folded bitline memory array of claim 1, wherein each metal wordline is coupled to half of the memory cells of the row of memory cells.

11. The folded bitline memory array of claim 1, wherein alternate polysilicon wordline segments of the row of memory cells are connected to the same metal word line.

12. The folded bitline memory array of claim 1, wherein each polysilicon wordline segment is coupled to four memory cells of the row of memory cells.

13. The folded bitline memory array of claim 1, wherein the memory cells include dual port planar capacitor DRAM cells.

14. A folded bitline memory array comprising:
   a first memory cell linearly adjacent to a second memory cell;
   a folded bitline connected to the first memory cell;
   a complementary folded bitline connected to the second memory cell;
   a first wordline segment coupled to the first memory cell; and,
   a second wordline segment coupled to the second memory cell, the first and second wordline segments being logically different wordlines.

15. The folded bitline memory array of claim 14, wherein the first memory cell shares a bitline contact with a third memory cell linearly adjacent to a fourth memory cell, and the second memory cell shares a common bitline contact with the fourth memory cell.

16. The folded bitline memory array of claim 15, wherein the first, second, third and fourth memory cells have planar storage capacitors.

17. The folded bitline memory array of claim 16, wherein two rows of linearly adjacent memory cells are offset with each other by a predetermined pitch.

18. A folded bitline memory array comprising:
   a first memory cell linearly adjacent to a second memory cell;
   a third memory cell linearly adjacent to the second memory cell and a fourth memory cell;
   a first folded bitline connected to the first memory cell;
   a first complementary folded bitline connected to the third memory cell;
   a second folded bitline connected to the second memory cell;
   a second complementary folded bitline connected to the fourth memory cell;
   a first wordline segment coupled to the first and second memory cells; and,
   a second wordline segment coupled to the third and fourth memory cells, the first and
   second wordline segments being logically different wordlines.

19. A folded bitline memory array comprising:
   a first memory cell linearly adjacent to a second memory cell;
   a third memory cell linearly adjacent to the second memory cell and a fourth memory cell;
   a first folded bitline connected to the first memory cell;
   a first complementary folded bitline connected to the fourth memory cell;
   a second folded bitlines connected to the second memory cell;
   a second complementary folded bitline connected to the third memory cell;
   a first wordline segment coupled to the first and second memory cells; and,
   a second wordline segment coupled to the third and fourth memory cells, the first and second wordline segments being logically different wordlines.

* * * * *